United States Patent
Nguyen et al.

(10) Patent No.: US 7,113,406 B1
(45) Date of Patent: Sep. 26, 2006

(54) METHODS AND APPARATUS FOR FASTENING A SET OF HEATSINKS TO A CIRCUIT BOARD

(75) Inventors: Nguyen Tu Nguyen, San Jose, CA (US); Long Huu Dang, San Jose, CA (US); Saeed Seyed, Los Altos Hills, CA (US)

(73) Assignee: Cisco Technology, Inc., San Jose, CA (US)

( * ) Notice: Subject to any disclaimer, the term of this patent is extended or adjusted under 35 U.S.C. 154(b) by 134 days.

(21) Appl. No.: 10/896,699

(22) Filed: Jul. 22, 2004

(51) Int. Cl.
*H05K 7/20* (2006.01)

(52) U.S. Cl. .............. 361/719; 361/704; 257/718; 257/719; 165/80.3; 165/185

(58) Field of Classification Search .......... 361/704, 361/719; 165/80.3, 185; 257/718, 719, 257/727; 174/16.1, 16.3
See application file for complete search history.

(56) References Cited

U.S. PATENT DOCUMENTS

| | | | | |
|---|---|---|---|---|
| 4,587,595 A | 5/1986 | Staples | .................. | 361/710 |
| 4,607,685 A | 8/1986 | Mitchell, Jr. | .............. | 165/80.3 |
| 5,198,887 A | 3/1993 | Brown | .................. | 361/717 |
| 5,295,043 A | 3/1994 | Beijer | .................. | 361/704 |
| 5,329,426 A * | 7/1994 | Villani | .................. | 361/719 |
| 5,640,305 A | 6/1997 | Smithers | .................. | 361/719 |
| 5,734,556 A | 3/1998 | Saneinejad et al. | ......... | 361/719 |
| 5,754,401 A | 5/1998 | Saneinejad et al. | ......... | 361/705 |
| 5,804,873 A | 9/1998 | Pelly | .................. | 257/675 |
| 5,808,236 A * | 9/1998 | Brezina et al. | ............ | 174/16.3 |
| 5,875,545 A | 3/1999 | DiStefano et al. | ............ | 29/840 |
| 5,894,882 A | 4/1999 | Kikuchi et al. | ............ | 165/80.3 |
| 5,917,700 A | 6/1999 | Clemens et al. | ............ | 361/704 |
| 6,034,874 A * | 3/2000 | Watanabe | ............... | 361/704 |
| 6,104,612 A | 8/2000 | Holland | .................. | 361/704 |
| 6,115,253 A | 9/2000 | Clemens et al. | ............ | 361/704 |
| 6,191,478 B1 | 2/2001 | Chen | .................. | 257/718 |
| 6,193,205 B1 | 2/2001 | Wang | .................. | 248/510 |
| 6,198,630 B1 | 3/2001 | Cromwell | .................. | 361/704 |
| 6,208,517 B1 | 3/2001 | Prince et al. | ............... | 361/704 |
| 6,222,734 B1 | 4/2001 | Bookhardt et al. | ......... | 361/719 |
| 6,239,972 B1 * | 5/2001 | Tehan et al. | ................. | 361/704 |

(Continued)

FOREIGN PATENT DOCUMENTS

EP          654822 A1 *  5/1995

OTHER PUBLICATIONS

TCM Thermal Reticle 32262, Research Disclosure, Feb. 1991, No. 322, Kenneth Mason Publications Ltd., England, 1 page.

(Continued)

*Primary Examiner*—Boris Chervinsky
(74) *Attorney, Agent, or Firm*—BainwoodHuang

(57) ABSTRACT

A circuit board module has a circuit board which includes a circuit board structure and a set of components mounted to the circuit board structure. The circuit board module further includes a set of heatsinks (i.e., one or more heatsinks) and a heatsink retaining assembly fastened to the circuit board. The heatsink retaining assembly includes (i) a set of brackets, each bracket being elongated in shape and having a first end and a second end, (ii) a frame, and (iii) a fastening mechanism configured to fasten the frame to a circuit board. The frame is configured to simultaneously hold the first and second ends of each bracket relative to the circuit board to enable that bracket to assert holding force on the set of heatsinks.

20 Claims, 5 Drawing Sheets

U.S. PATENT DOCUMENTS

| | | |
|---|---|---|
| 6,269,863 B1 | 8/2001 | Wyler .................. 165/80.3 |
| 6,293,331 B1 | 9/2001 | Wang .................. 165/80.3 |
| 6,315,038 B1 | 11/2001 | Chiu .................. 165/185 |
| 6,353,537 B1 | 3/2002 | Egawa .................. 361/704 |
| 6,401,807 B1 | 6/2002 | Wyler et al. .................. 165/121 |
| 6,430,052 B1 | 8/2002 | Kordes et al. .................. 361/719 |
| 6,492,202 B1 | 12/2002 | Lober et al. .................. 438/122 |
| 6,508,300 B1 | 1/2003 | Hegde .................. 165/80.3 |
| 6,545,871 B1* | 4/2003 | Ramspacher et al. .................. 361/709 |
| 6,600,652 B1 | 7/2003 | Chandran et al. .................. 361/704 |
| 6,672,892 B1 | 1/2004 | Chandran et al. .................. 439/330 |
| 6,707,675 B1* | 3/2004 | Barsun et al. .................. 361/704 |
| 6,714,416 B1* | 3/2004 | McLeod et al. .................. 361/719 |
| 6,728,103 B1 | 4/2004 | Smedberg .................. 361/703 |
| 6,771,506 B1* | 8/2004 | Lee et al. .................. 361/704 |
| 6,778,395 B1* | 8/2004 | Dong et al. .................. 361/704 |
| 6,856,511 B1 | 2/2005 | Viernes et al. .................. 361/704 |
| 6,980,437 B1* | 12/2005 | Bright .................. 361/704 |
| 2001/0030037 A1 | 10/2001 | Hellbruck et al. .................. 165/80.3 |
| 2004/0105236 A1* | 6/2004 | Lee et al. .................. 361/704 |

OTHER PUBLICATIONS

Assembled Heat Sinks Folded Assemblies, Sep. 20, 2002, http://www.aavidthermalloy.com/products/foldedfin/index.shtml, 2 pages.

* cited by examiner

METHODS AND APPARATUS FOR FASTENING A SET OF HEATSINKS TO A CIRCUIT BOARD

BACKGROUND

In general, a heat sink is a thermally conductive device that dissipates heat from one or more circuit board components into the surrounding air. An air stream generated by a fan assembly then carries the heat away. Such operation enables the circuit board components to operate in a lower temperature range without increasing the likelihood of operating incorrectly and/or sustaining damage. Examples of circuit board components that use heat sinks include high speed processors, Field Programmable Gate Arrays, and optical transceivers.

There are a variety of conventional approaches for mounting a heat sink to a circuit board component. One conventional approach (hereinafter referred to as the "adhesive approach") involves the circuit board manufacturer (or supplier) affixing the heat sink to the component package using an adhesive (e.g., tape, glue, combinations thereof, etc.) having a high thermal transfer coefficient. In this approach, the manufacturer applies the adhesive between the circuit board component and the heat sink. Glue-like material within the adhesive then cures (perhaps with the addition of heat) to fasten the heat sink directly to the outer surface of the component package. Accordingly, when the component is in operation, the heat sink, which is now held in place by the adhesive, conveys heat from the component into the surrounding air.

Another conventional approach (hereinafter referred to as the "adjacent anchor approach") involves the circuit board manufacturer providing mounting holes in circuit board locations surrounding the circuit board component. In this approach, the manufacturer then installs anchors (i.e., threaded metallic posts, nuts, U-shaped elements, etc.) on the circuit board through the mounting holes. The manufacturer secures the anchors to the circuit board using either hardware or solder joints. Next, the manufacturer places the heat sink over the top of the component, perhaps with thermal transfer material disposed between the heatsink and the top of the component package to facilitate heat transfer therebetween. Next, the manufacturer rigidly secures the heat sink to the anchors. As a result, when the component is in operation, the heatsink, which is now held rigidly in place by the anchors, conducts heat from the component and dissipates that heat into a neighboring air stream.

In yet another conventional approach (hereinafter referred to as the "clip approach"), the heatsink includes built-in clips. During installation, the manufacturer positions the clips so that the clips grab directly on to the sides of the component package to secure the heatsink to the component package.

SUMMARY

Unfortunately, there are deficiencies to the above-described conventional approaches to mounting a heat sink to a circuit board component. For example, in connection with the above-described conventional adhesive approach, vendors often do not precisely follow instructions from the manufacturer for applying the adhesive between the component packages and the heatsinks. In particular, the vendors may apply an insufficient amount of pressure for an insufficient amount of time (e.g., two minutes rather than 10 minutes) due to high volume production requirements. Additionally, conventional adhesives are prone to failure over time. That is, as the glue-like material within the adhesive ages, it tends to becomes brittle as well as lose its elasticity and holding strength. Eventually, the combination of time, vibration and high temperature cause the adhesive's holding characteristics to deteriorate to the point where the heat sink separates from the circuit board component. In some heat sink separation situations, the loss of the heat sink's cooling operation and/or uncontrolled movement of the heat sink may result in damage to circuit board components or the circuit board itself. Furthermore, even if the adhesive successfully maintains its holding characteristics, there may be situations a user would like to remove the heat sink (e.g., to inspect the area around the circuit board component in detail, to replace the circuit board component, etc.). In such situations, it is an ugly process for a technician to remove the heat sink from the component, and any adhesive remaining on the heat sink tends to hinder the heat sink's thermal transfer capabilities thus rendering the heat sink unsalvageable.

Additionally, in the above-described conventional adjacent anchor approach, the circuit board manufacturer must sacrifice space immediately around the circuit board component to enable attachment of penetrating anchors. In particular, the manufacturer must sacrifice a significant amount of circuit board real estate in order to provide mounting holes and associated keep-out regions (i.e., antipads). The inner layer real estate around the circuit board component is often particularly precious since the component typically has a high density of contacts (e.g., a Ball Grid Array, a Ceramic Column Grid Array, etc.) which must electrically connect to pads and traces leading to other locations of the circuit board. If the manufacturer did not need to sacrifice this inner layer real estate to accommodate the standoffs or anchors, the manufacturer could utilize such space for other purposes (e.g., signal traces leading to and from the component mounting location, etc.). Moreover, even if circuit board space is adequate, the manufacturer risks damaging the circuit board when the manufacturer installs the anchors onto the circuit board, e.g., the loose hardware can scratch or cut surface traces if dropped onto the circuit board, debris associated with the loose hardware can fall off the loose hardware and contaminate the circuit board, etc.

Furthermore, in connection with the conventional clip approach, the heatsinks which have built-in clips are relatively small and light weight due to inadequacies in the ability of the clips to secure heavier heatsinks. Accordingly, the conventional clip approach is insufficient for tasks of mounting relatively large heatsinks and for mounting heatsinks over relatively large areas such as over multiple components.

In contrast to the above-described conventional approaches to mounting a heat sink to a circuit board, embodiments of the invention are directed to techniques for fastening a set of heatsinks (i.e., one or more heatsinks) to a circuit board using a frame which is configured to hold ends of elongated brackets such that the elongated brackets apply holding force on the set of heatsinks. The frame is capable of mounting around a periphery of the circuit board so as not to encumber circuit board real estate immediately adjacent component mounting locations. Additionally, the frame is capable of supporting multiple elongated brackets for flexibility (e.g., the brackets can be positioned to accommodate a variety of heatsink shapes, sizes and heights) and robustness (e.g., the brackets can be positioned to hold multiple heatsinks in a cost effective manner).

One embodiment of the invention is directed to a circuit board module having a circuit board which includes a circuit board structure and a set of components mounted to the circuit board structure. The circuit board module further includes a set of heatsinks (i.e., one or more heatsinks) and a heatsink retaining assembly fastened to the circuit board. The heatsink retaining assembly includes (i) a set of brackets, each bracket being elongated in shape and having a first end and a second end, (ii) a frame, and (iii) a fastening mechanism configured to fasten the frame to a circuit board. The frame is configured to simultaneously hold the first and second ends of each bracket relative to the circuit board to enable that bracket to assert holding force on the set of heatsinks.

BRIEF DESCRIPTION OF THE DRAWINGS

The foregoing and other objects, features and advantages of the invention will be apparent from the following description of particular embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

Embodiments of the invention are directed to techniques for fastening a set of heatsinks (i.e., one or more heatsinks) to a circuit board using a frame which is configured to hold ends of elongated brackets such that the elongated brackets apply holding force on the set of heatsinks thus keeping the set of heatsinks in place relative to the circuit board. The frame is capable of mounting around a periphery of the circuit board so as not to encumber circuit board real estate immediately adjacent component mounting locations. Additionally, the frame is capable of supporting multiple elongated brackets for flexibility (e.g., the brackets can be positioned and shaped to accommodate a variety of heatsink shapes, sizes, heights and configurations) and robustness (e.g., the brackets can be positioned to hold multiple heatsinks in a cost effective manner and/or a heatsink that cools multiple devices, etc.).

Figure 1:
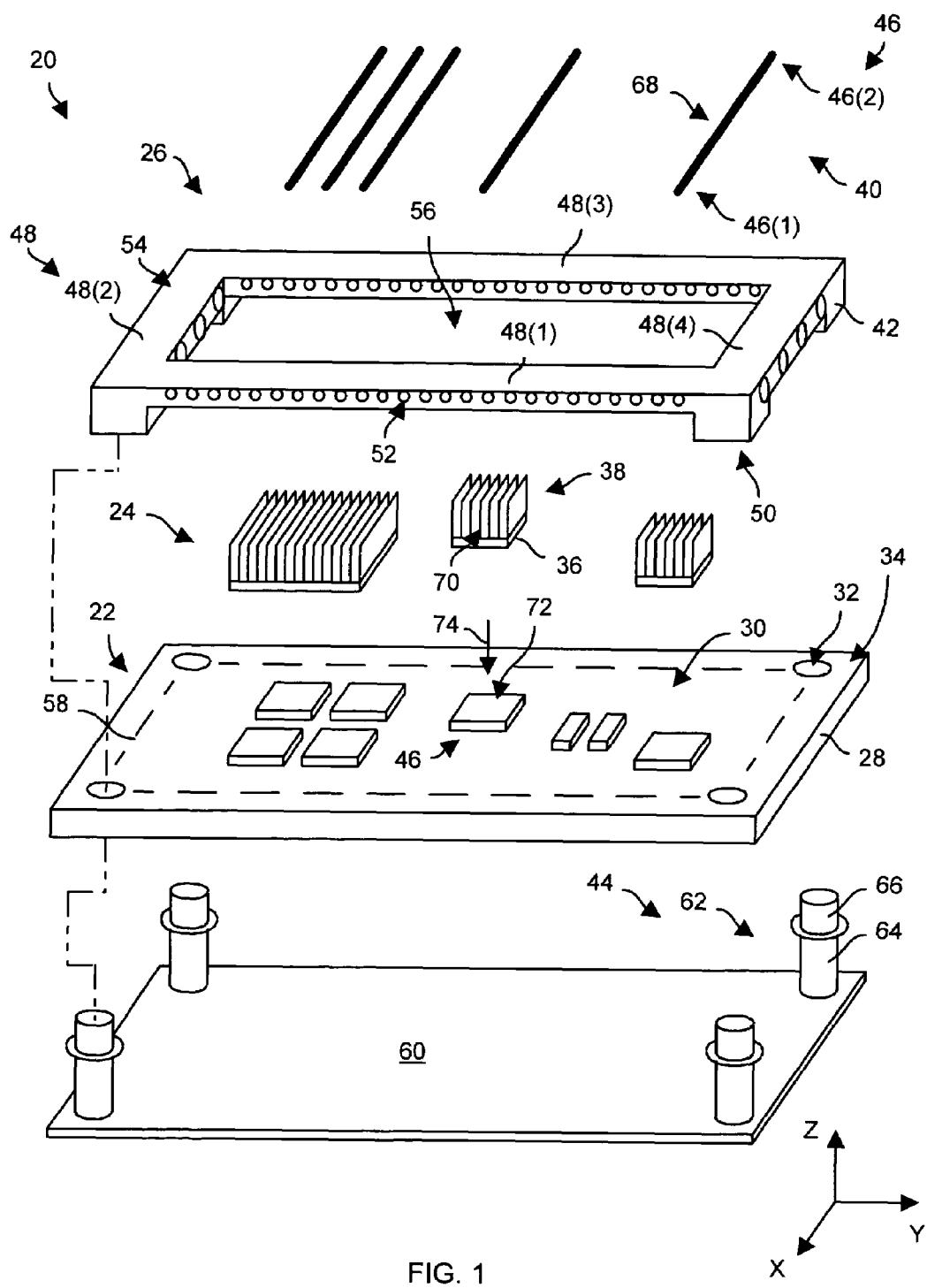
FIG. 1 shows an exploded view of a circuit board module which is suitable for use by the invention.

FIG. 1 shows an exploded view of a circuit board module 20 which is suitable for use by the invention. As shown in FIG. 1, the circuit board module 20 includes a circuit board 22, a set of heatsinks 24 (i.e., one or more heatsinks 24), and a heatsink retaining assembly 26. The circuit board 22 includes circuit board structure 28 and a set of components 30 mounted to the circuit board structure 28. The circuit board structure 28 includes layers of non-conductive material (e.g., FR-4) and conductive material (e.g., copper signal layers, power and ground planes, pads, etc.) sandwiched together to form a rigid, rectangle-shaped substrate that extends along the X-Y plane. Holes 32 reside at corners 34 of the circuit board structure 28 for a variety of uses such as for alignment during circuit board fabrication and assembly (e.g., for proper registration by drilling equipment) and for component attachment (e.g., for securing a metallic tray to the circuit board 22 for EMI protection).

By way of example only, each heatsink 24 includes a base 36 and a set of fins 38 that extend from the base 36 in the Z-direction which is perpendicular to the circuit board 22. It should be understood that other heatsink configurations and heat-relief structures are suitable for use as well such as disk-shaped or post-array/column-array heatsinks, baffle-shaped airflow directors, heat pipes, and the like.

The heatsink retaining assembly 26 includes a set of brackets 40 (i.e., one or more brackets 40), a frame 42 and a fastening mechanism 44. Each bracket 40 is elongated in shape and has a first end 46(1) and a second end 46(2) (collectively, ends 46). The frame 42 includes four elongated support members 48(1, 48(2), 48(3) and 48(4) (collectively, elongated support members 48) and a set of standoff portions (or simply legs) 50. The elongated support members 48 define grooves 52 (e.g., holes, channels, notches, etc.) to capture the ends 46 of the brackets 40 when the circuit board module 20 is fully assembled. The elongated support members 48 further define a rectangle 54 and a central opening 56 to keep the members 48 out of the way from the set of components 30 and thus provide convenient access to the set of components 30 (e.g., for airflow, for heatsink access to the components 30, etc.). The standoff portions 50 elevate the elongated support members 48 in a substantially parallel manner relative to the circuit board 22 along the X-Y plane when the frame 42 is properly installed on the circuit board 22 thus providing additional access to the set of components 30 (e.g., for enhanced airflow).

In one arrangement, the frame 42 is made of metal and is preferably grounded to a ground layer of the circuit board structure 28. In another arrangement, the frame 42 is made of non-conductive material (e.g., plastic). In these arrangements, the grooves 52 run in a distributed manner along the elongated support members 48 to allow for a variety of positions for the brackets 40, e.g., at 0.200 inch intervals.

In some arrangements and as shown in FIG. 1, the elongated support members 48 extend around a periphery 58 of the circuit board 22, and the standoff portions 50 are distributed around the periphery 58 in order to minimize the intrusiveness of the frame 42. Accordingly, the heatsink retaining assembly 26 generally does not include parts that would otherwise encumber circuit board real estate immediately around any component 30 as in a conventional anchor approach which uses anchors immediately adjacent a component to fasten a heatsink to that component.

Additionally, in some arrangements, the fastening mechanism 44 of the heatsink retaining assembly 26 is combinable with other structures to perform additional operations. For example, as shown in FIG. 1, the circuit board 20 further includes a metallic tray 60 which is configured to provide electromagnetic interference (EMI) shielding to the circuit board 22. Here, the fastening mechanism 44 includes threaded hardware 62 which connects to the tray 60. In particular, the threaded hardware 62 is in the form of rotatable threaded posts having standoff portions 64 which provide separation between the tray 60 and the circuit board 22, and threaded portions 66 which pass through the circuit board holes 32 and engage the standoff portions 50 of the frame 42 (e.g., the threaded portions 66 screw into the standoff portions 50 of the frame 42). Accordingly, the threaded hardware 62 concurrently holds both the tray 60 and the frame 42 in place in a substantially parallel manner along the X-Y plane. Such a configuration is particularly suitable for use in high-density situations such as when multiple circuit board modules 20 reside next to each other within a card cage thus preventing EMI generated by one circuit board module 20 from interfering with adjacent circuitry, e.g., another circuit board module 20.

As an alternative example, the fastening mechanism 44 includes standard hardware (bolts, screws, nuts, etc.). Here, the hardware (or alternatively parts of the standoff portions 50) extend through the circuit board holes 32 for rigid fastening on the other ends.

As shown in FIG. 1, the brackets 40 are configured to fasten to the frame 42. In particular, the ends 46 engage the grooves 52 of the elongated support members 48. In this situation, mid-portions 68 of the brackets 40 extend along gaps 70 between heatsink fins 38 to apply holding force onto the heatsink bases 36 in a direction toward top surfaces 72 of the components 30, see the arrow 74 in FIG. 1. In some arrangements, the components 30 are high power devices (e.g., an area array package with a bare die of approximately 0.47 inches by 0.40 inches). Accordingly, the heatsink retaining assembly 26 robustly holds the set of heatsinks 24 in place relative to the circuit board 22 and the set of components 30.

In some arrangements, the brackets 40 align in a parallel manner to each other (e.g., along the X-direction), and include resilient metallic material. For example, in one arrangement, the mid-portions 68 are leaf spring type metal elements that extend across the frame 42 to provide spring tension against the set of heatsinks 24 (e.g., wire form retainers which hook into the grooves 52). Such arrangements alleviate the need to consume circuit board space immediately adjacent the components as in conventional anchor approaches, and enable the brackets 40 to take a variety of shapes and sizes in order to accommodate a multitude of different circuit board and component shapes, sizes, heights and geometries thus providing a flexible and fully accommodating design. Moreover, such arrangements do not require the heatsinks 24 to directly grab the component packages where situations of insufficient gripping strength may occur as in conventional adhesive or conventional clip approaches. Further details will now be provided with reference to FIGS. 2 and 3.

Figure 2:
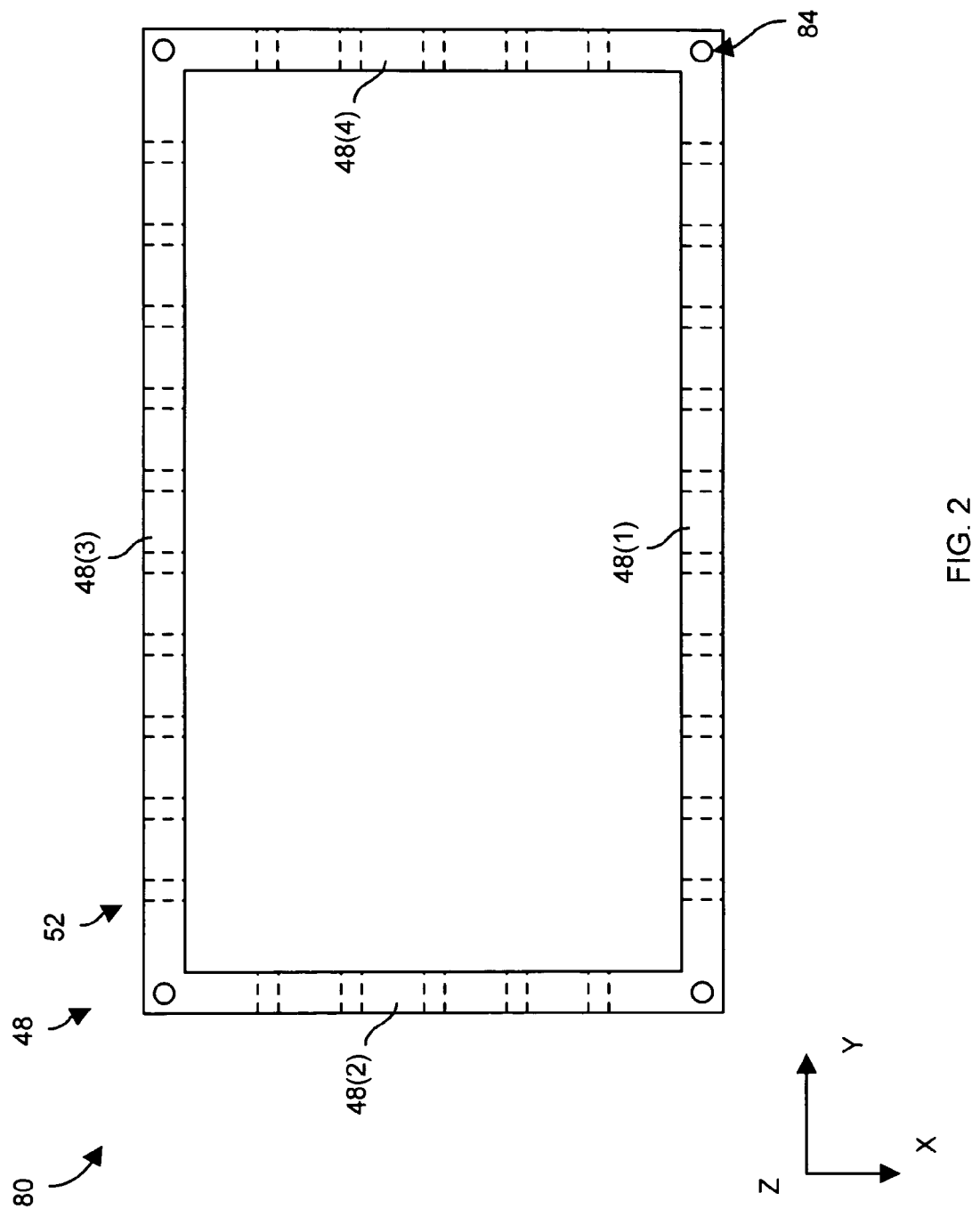
FIG. 2 shows a top view of a frame of a heatsink retaining assembly of the circuit board module of FIG. 1.
Figure 3:
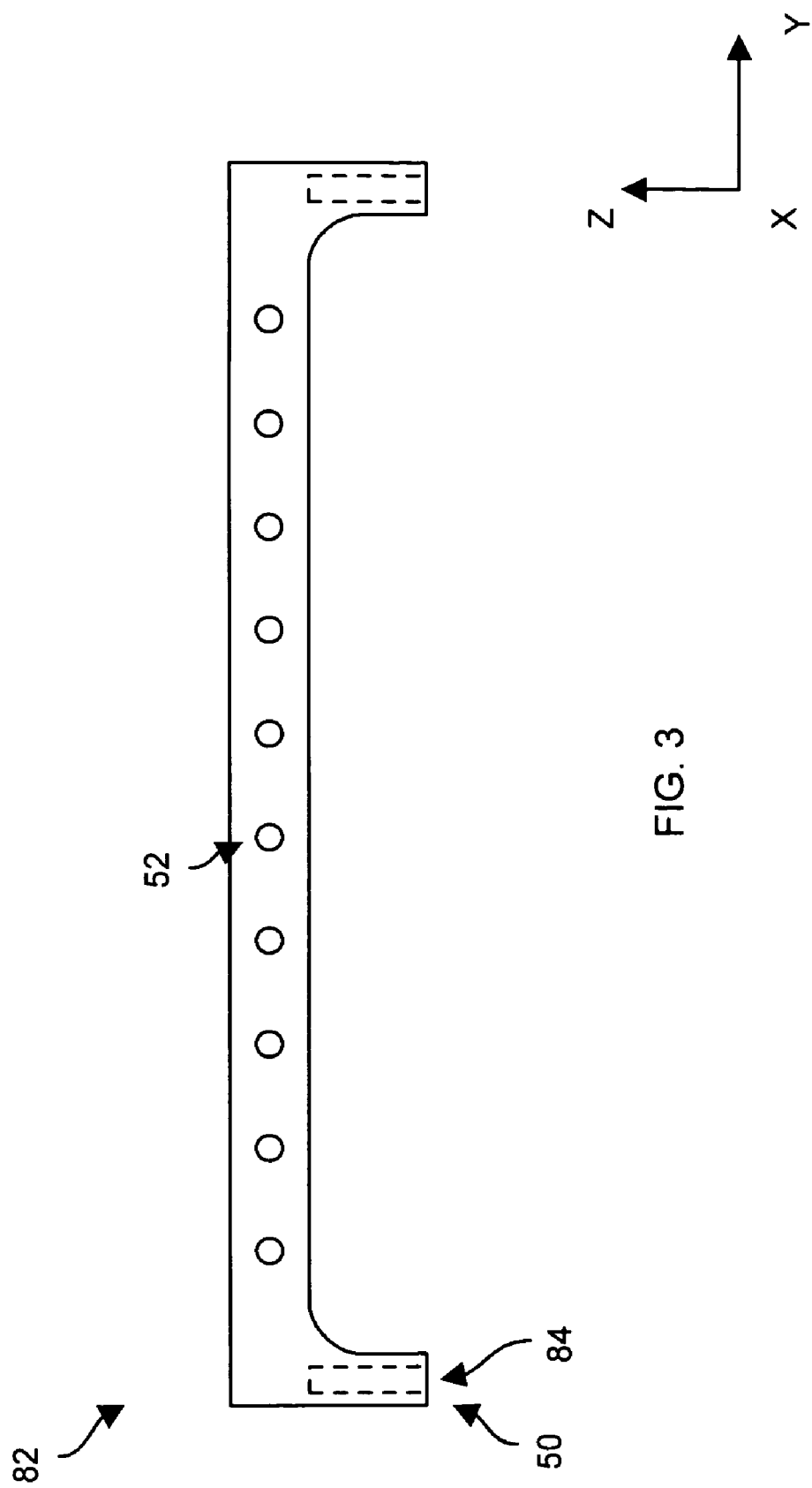
FIG. 3 shows a side view of the frame of the heatsink retaining assembly of FIG. 2.

FIG. 2 is a top view 80 and FIG. 3 is a side view 82 of the frame 42 of the heatsink retaining assembly 26. As shown in FIGS. 2 and 3, grooves 52 reside along each elongated support member 48 thus enabling the frame 42 to accommodate a variety of components 30 at different locations. That is, the same frame 42 can be used on different circuit boards 22 having different component layouts. Accordingly, the manufacture does not need to make a different frame 42 for each different circuit board design. Moreover, there is no restriction to the direction of the brackets 40. In particular, the brackets 40 are shown as extending along the X-direction in FIG. 1 by way of example only. Since the elongated support members along the X-direction define grooves 52, the brackets 40 are capable of alternatively extending along the Y-direction instead of the X-direction. As a result, the heatsink retaining assembly 26 is capable of being utilized by virtually any PCB regardless of size or shape.

Additionally, as shown in FIGS. 2 and 3, the standoff portions 50 define threaded cavities 84 to engage with the fastening mechanism 44 (i.e., see the threaded portions 66 of the threaded hardware 62 in FIG. 1). The standoff portions 50 of the frame 42 reside at locations away from the central opening 56 defined by the elongated support members 38.

Accordingly, the heatsink retaining assembly 26 does not interfere with the circuit board structure 28 or the components 30. Rather, the heatsink retaining assembly 26 attaches around the periphery 58 of the circuit board 22 thus leaving the areas immediately around the components 30 unencumbered and available for other circuit board structures, e.g., other components, signal traces, etc. As a result, the brackets 40 are essentially capable of forming a robust network of wire form retainers for reliably holding the set of heatsinks 24 in place. Further details of the invention will now be provided with reference to FIG. 4.

Figure 4:
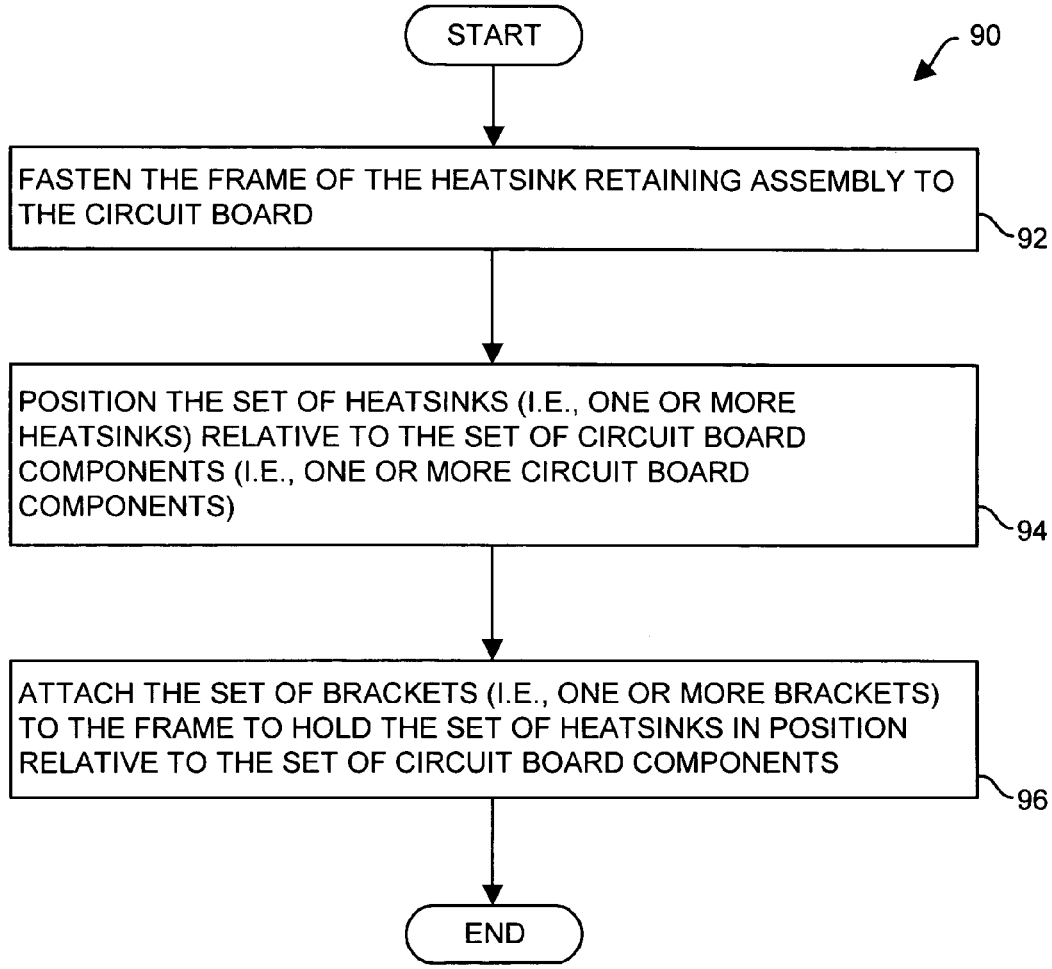
FIG. 4 is a flowchart of a procedure which is performed by a manufacturer when installing a set of heatsinks using the frame of FIGS. 2 and 3.

FIG. 4 is a flowchart of a procedure 90 which is performed by a manufacturer of the circuit board module 20 when installing the set of heatsinks 24 using the heatsink retaining assembly 26. In step 92, the manufacturer fastens the frame 42 of the heatsink retaining assembly 26 to the circuit board 22. For example, when using a metallic tray 60 with rotatably attached threaded hardware 62 as a fastening mechanism 44, the manufacturer positions the frame 42 and the tray 60 relative to the circuit board structure 28 so that the threaded hardware 62 aligns with the standoff portions 50 through the holes 32 defined by the circuit board structure 28. The manufacturer then screws the threaded hardware 62 into the standoff portions 50 so that both the frame 42 and tray 60 are simultaneously held in place relative to the circuit board structure 28 with minimal consumption of circuit board real estate. As another example, the manufacturer simply uses threaded hardware (bolts, screws, etc.) as the fastening mechanism 44. This step is capable of being performed manually or by automated equipment.

In step 94, the manufacturer positions the set of heatsinks 24 relative to the set of components 30. In particular, the manufacturer places the bases 36 of the heatsinks 24 in contact with the top surfaces 72 of the components 30. In one arrangement, the manufacturer disposes thermal transfer material (e.g., a substance with high thermal conductivity) between the heatsink bases 36 and the component tops 72 for enhanced heat transfer.

In step 96, the manufacturer attaches the set of brackets 40 to the frame 42. In particular, the manufacturer inserts the ends 46 of the brackets 40 into the grooves 52 of the elongated support members 48. As a result, each bracket 40 now asserts a robust holding force on a heatsink 24 to hold the set of heatsinks in place relative to the circuit board 22 and the circuit board components 30. Such a configuration provides a cost effective heatsink retaining solution, ease of layout, versatility to accommodate different packages (e.g., ICs, multi-chip modules, etc.), different package heights, etc.

As mentioned above, embodiments of the invention are directed to techniques for fastening a set of heatsinks 24 to a circuit board 22 using a frame 42 which is configured to hold ends 46 of elongated brackets 48 such that the elongated brackets 48 apply holding force on the set of heatsinks 24. The frame 42 is capable of mounting around a periphery of the circuit board 22 so as not to encumber circuit board real estate immediately adjacent component mounting locations. Additionally, the frame 42 is capable of supporting multiple elongated brackets 40 for flexibility (e.g., the brackets 40 can be positioned and shaped to accommodate a variety of heatsink shapes, sizes, heights and configurations) and robustness (e.g., the brackets 40 can be positioned to hold multiple heatsinks 24 in a cost effective manner and/or a heatsink 24 that cools multiple devices, etc.).

While this invention has been particularly shown and described with references to preferred embodiments thereof, it will be understood by those skilled in the art that various changes in form and details may be made therein without departing from the spirit and scope of the invention as defined by the appended claims.

For example, it should be understood that the set of heatsinks 38 includes heatsinks of a variety of different shapes and sizes. The heatsink retaining assembly 26 is capable of holding a single heatsink 24 or multiple heatsinks 24 (e.g., four to 20 per circuit board 22). By way of example, one large heatsink 24 uses multiple brackets 40 for robust support (see the large heatsink 24 which uses three brackets 40 in FIG. 1). Alternatively, a single bracket 40 is capable of supporting multiple heatsinks 24. Such modifications and variations are intended to be within the scope of various embodiments of the invention.

Figure 5:
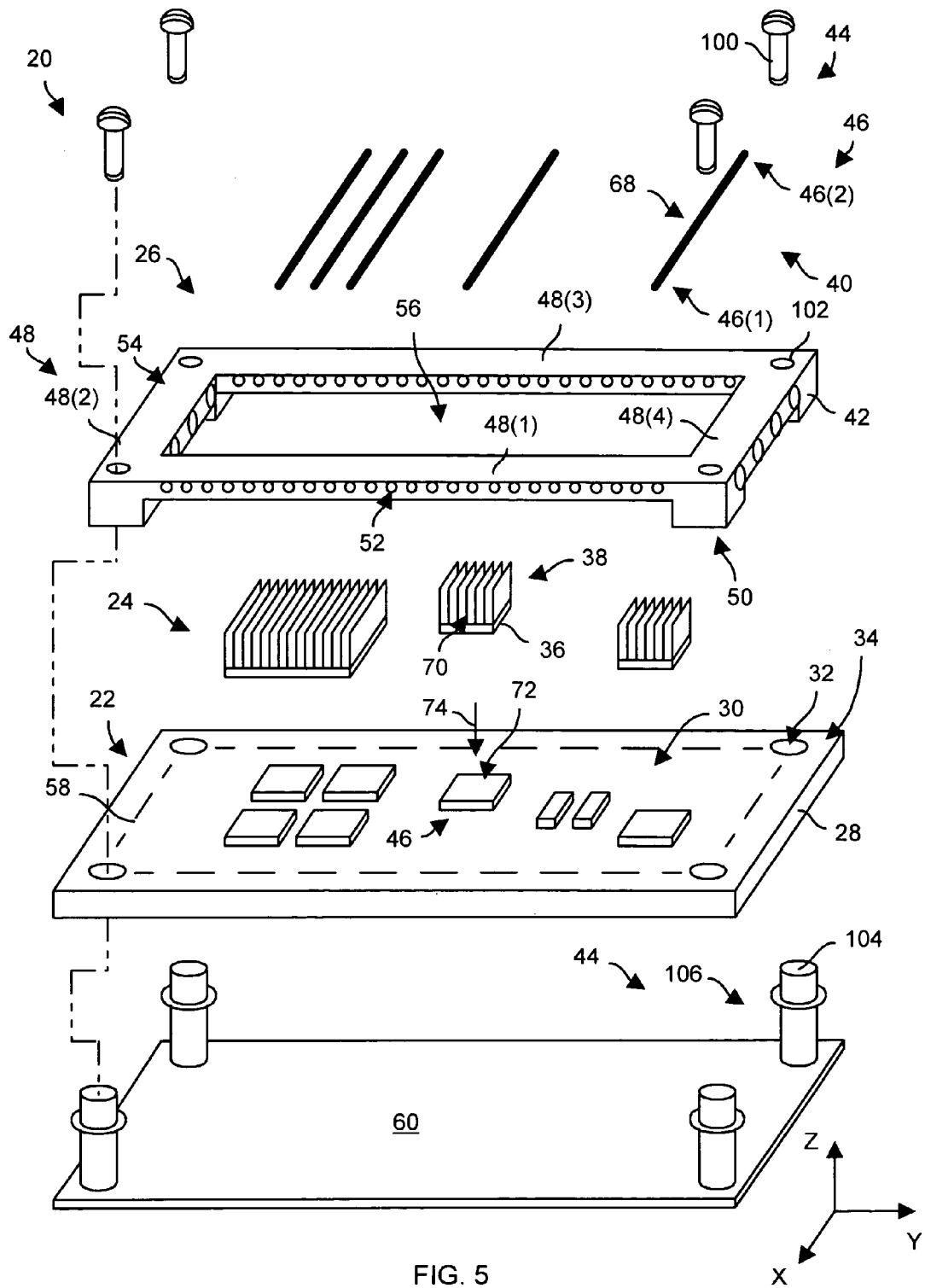
FIG. 5 shows an exploded view of a circuit board module which uses hardware in an alternative arrangement to that shown in FIG. 1.

Additionally, it should be understood that the fastening mechanism 44 of the heatsink retaining assembly 26 was described above as including threaded hardware which installs from the tray side of the circuit board module 20 through the holes 32 of the circuit board structure 28. Other configurations are suitable for use as well. For example, FIG. 5 shows an alternative arrangement in which the fastening mechanism 44 includes a set of screws 100 which install through holes 102 within the frame 42 first (i.e., the cavities 84 extend completely through the frame 42, also see FIGS. 2 and 3). Each screw 100 then passes through a respective hole 32 of the circuit board structure 28 to attach to the tray 60 such as by threading into holes 104 within a standoff 106 which is integrated with the tray 60 (show for illustration purposes in FIG. 5), into the tray 60 itself, or into nuts beneath the tray 60.

Furthermore, it should be understood that the set of brackets 40 was described above as including wire forms having ends 46 which insert into the frame 42 by way of example only. Other configurations are suitable for use as well. For example, the set of brackets 40 are capable of including plane-shaped rigid beam members which extend across the central frame opening 56. Such beam members are capable of engaging with the frame 42 by inserting into the grooves 52 and provide further stability to the set of heat sinks 24. Alternatively, such beam members are capable of securing to the frame 42 using hardware (e.g., screws or bolts which thread into the frame 42 or into corresponding nuts, etc.). Such modifications and enhancements are intended to belong to various embodiments of the invention.

What is claimed is:

1. A circuit board module comprising:
   a circuit board including a circuit board structure and a set of components mounted to the circuit board structure;
   a set of heatsinks; and
   a heatsink retaining assembly fastened to the circuit board, the heatsink retaining assembly including
   (i) a set of brackets, each bracket being elongated in shape and having a first end and a second end,
   (ii) a frame, the frame of the heatsink retaining assembly includes four elongated support members which substantially define a rectangle, and
   (iii) a fastening mechanism configured to fasten the frame to the circuit board, the frame being configured to simultaneously hold the first and second ends of each bracket relative to the circuit board to enable that bracket to assert holding force on the set of heatsinks and wherein the four elongated support members extend around a periphery of the circuit board when the fastening mechanism fastens the frame to the circuit board.

2. The circuit board module of claim 1 wherein each elongated support member of the frame defines a series of grooves configured to receive an end of a bracket.

3. The circuit board module of claim 1 wherein the set of brackets includes multiple brackets, and wherein the frame is configured to hold the multiple brackets substantially parallel to each other.

4. The circuit board module of claim 3 wherein each bracket includes a resilient metallic portion configured to apply, as the holding force, spring tension against at least one heatsink.

5. The circuit board module of claim 1 wherein the four elongated support members reside within an X-Y plane which is substantially parallel to a plane defined by the circuit board when the fastening mechanism fastens the frame to the circuit board.

6. The circuit board module of claim 5 wherein the fastening mechanism includes threaded hardware, and wherein the frame further includes a set of standoff portions, each standoff portion being substantially perpendicular to the X-Y plane and being configured to engage the threaded hardware when the frame fastens to the circuit board.

7. The circuit board module of claim 6 wherein the circuit board is rectangular in shape, wherein the circuit board defines a hole in each corner, and wherein the threaded hardware is configured to mount to the frame through the hole in each corner.

8. The circuit board module of claim 7, further comprising:
   a tray assembly which is substantially parallel to the circuit board, the tray assembly having threaded members configured to engage the set of standoff portions of the frame to fasten the frame to the circuit board.

9. A circuit board module of claim 1 wherein
   the four elongated support members reside within an X-Y plane which is substantially parallel to a plane defined by the circuit board when the fastening mechanism fastens the frame to the circuit board;
   the frame has a set of standoff portions, the standoff portions elevating the elongated support members in a substantially parallel manner relative to the circuit board; and
   the fastening mechanism includes threaded hardware and a metallic tray, the metallic tray assembly substantially parallel to the circuit board and providing electromagnetic interference (EMI) shielding to the circuit board, and wherein each standoff portion being substantially perpendicular to the X-Y plane and being configured to engage the threaded hardware when the frame fastens to the circuit board.

10. A circuit board module of claim 9 wherein the sets of brackets include multiple brackets capable of engaging the same heatsink, and wherein the frame is configured to hold the multiple brackets substantially parallel to each other.

11. A circuit board module of claim 10 wherein each bracket includes a resilient metallic portion configured to apply, as the holding force, spring tension against at least one heatsink.

12. A heatsink retaining assembly comprising:
    a set of brackets, each bracket being elongated in shape and having a first end and a second end;
    a frame, the frame includes four elongated support members which substantially define a rectangle, and
    a fastening mechanism configured to fasten the frame to a circuit board, the frame being configured to simultaneously hold the first and second ends of each bracket relative to the circuit board to enable that bracket to assert holding force on a set of heatsinks when the fastening mechanism fastens to the circuit board and wherein the four elongated support members extend around a periphery of the circuit board when the fastening mechanism fastens the frame to the circuit board.

13. The heatsink retaining assembly of claim 12 wherein each elongated support member of the frame defines a series of grooves configured to receive an end of a bracket.

14. The heatsink retaining assembly of claim 12 wherein the set of brackets includes multiple brackets, and wherein the frame is configured to hold the multiple brackets substantially parallel to each other.

15. The heatsink retaining assembly of claim 14 wherein each bracket includes a resilient metallic portion configured to apply, as the holding force, spring tension against at least one heatsink.

16. The heatsink retaining assembly of claim 12 wherein the four elongated support members reside within an X-Y plane which is substantially parallel to a plane defined by the circuit board when the fastening mechanism fastens the frame to the circuit board.

17. The heatsink retaining assembly of claim 16 wherein the fastening mechanism includes threaded hardware, and wherein the frame further includes a set of standoff portions, each standoff portion being substantially perpendicular to the X-Y plane and being configured to engage the threaded hardware when the frame fastens to the circuit board.

18. A heatsink retaining assembly, comprising:
a set of brackets, each bracket being elongated in shape and having a first end and a second end;
a frame, the frame including four elongated support members that substantially define a rectangle;
a fastening mechanism configured to fasten the frame to a circuit board wherein the four elongated support members extend around a periphery of the circuit board, the frame including means for simultaneously hold the first and second ends of each bracket relative to the circuit board to enable that bracket to assert holding force on a set of heatsinks when the fastening mechanism fastens to the circuit board.

19. A method for fastening a set of heatsinks to a circuit board, the method comprising:
fastening a frame to the circuit board wherein the frame includes four elongated support members which substantially define a rectangle, and wherein attaching includes:
orienting the four elongated support members to extend around a periphery of the circuit board
positioning a set of heatsinks relative to a set of components of the circuit board; and
attaching a set of brackets to the frame, each bracket being elongated in shape and having a first end and a second end, the frame simultaneously holding the first and second ends of each bracket relative to the circuit board to enable that bracket to assert holding force on the set of heatsinks when the set of the brackets is attached to the frame.

20. The method of claim 19 wherein attaching further includes:
engaging threaded members of a tray assembly to simultaneously (i) install a tray assembly in a position which is substantially parallel to the circuit board and (ii) secure the frame to the circuit board.

* * * * *